(12) United States Patent
Kim et al.

(10) Patent No.: US 11,643,362 B2
(45) Date of Patent: May 9, 2023

(54) DISPLAY DEVICE AND MANUFACTURING METHOD THEREOF

(71) Applicant: Samsung Display Co., Ltd., Yongin-si (KR)

(72) Inventors: Tae Kon Kim, Asan-si (KR); Chun Gi You, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 343 days.

(21) Appl. No.: 16/996,655

(22) Filed: Aug. 18, 2020

(65) Prior Publication Data

US 2021/0055757 A1 Feb. 25, 2021

(30) Foreign Application Priority Data

Aug. 20, 2019 (KR) .................. 10-2019-0101908

(51) Int. Cl.
*H10K 77/10* (2023.01)
*G02F 1/1333* (2006.01)
(Continued)

(52) U.S. Cl.
CPC ............ *C03C 23/002* (2013.01); *C03C 15/00* (2013.01); *G02B 1/14* (2015.01); *G02F 1/133351* (2013.01); *H01L 51/0096* (2013.01); *H01L 51/56* (2013.01); *G02F 1/133302* (2021.01); *G02F 2201/56* (2013.01);
(Continued)

(58) Field of Classification Search
CPC ............ G02F 1/133351; G02F 1/1339; G02F 2201/56; H05K 2203/107; H05K 3/0026; H01L 2251/566; H01L 51/56; B23K 26/00; B23K 26/38; B23K 26/0006; B23K 26/0093; B32B 38/105; C03C 15/00; C03C 23/002; Y02P 70/50
See application file for complete search history.

(56) References Cited

U.S. PATENT DOCUMENTS 10,170,728 B2   1/2019  Kim et al.
2005/0174525 A1* 8/2005  Tsuboi .................. G02F 1/1333
                                              349/1
(Continued)

FOREIGN PATENT DOCUMENTS

KR       10-1358385 B1     2/2014
KR    10-2018-0005325 A    1/2018

*Primary Examiner* — Jonathan Y Jung
(74) *Attorney, Agent, or Firm* — Lewis Roca Rothgerber Christie LLP

(57) ABSTRACT

A display device according to some exemplary embodiment includes: a display area; a non-display area surrounding the display area and including a sealing area; a first substrate including a center portion including a portion in the display area and an external portion including a portion in the sealing area; a second substrate including a center portion including a portion in the display area and an external portion including a portion in the sealing area; and a sealing portion between the first substrate and the second substrate and in the sealing area, wherein a thickness of the center portion of the first substrate is different from a thickness of the external portion of the first substrate, and a thickness of the center portion of the second substrate is different from a thickness of the external portion of the second substrate.

14 Claims, 20 Drawing Sheets

(51) Int. Cl.
*H10K 102/00* (2023.01)
*C03C 23/00* (2006.01)
*G02B 1/14* (2015.01)
*H01L 51/00* (2006.01)
*H01L 51/56* (2006.01)
*C03C 15/00* (2006.01)
*H05K 3/00* (2006.01)

(52) U.S. Cl.
CPC .. *H01L 2251/558* (2013.01); *H01L 2251/566* (2013.01); *H05K 3/0026* (2013.01); *H05K 2203/107* (2013.01)

(56) References Cited

U.S. PATENT DOCUMENTS

| | | | | |
|---|---|---|---|---|
| 2010/0053512 | A1* | 3/2010 | Taniguchi | G02F 1/133514 349/153 |
| 2011/0216282 | A1* | 9/2011 | Nagami | G02F 1/1339 349/158 |
| 2014/0252944 | A1* | 9/2014 | Lee | H05B 33/12 313/504 |
| 2016/0170249 | A1* | 6/2016 | Lee | G02F 1/1339 349/33 |
| 2016/0268313 | A1* | 9/2016 | Qin | H01L 27/1218 |
| 2017/0199431 | A1* | 7/2017 | Kim | G02F 1/133723 |
| 2018/0083086 | A1* | 3/2018 | Wang | H01L 51/524 |
| 2019/0011605 | A1* | 1/2019 | Park | C03C 23/002 |
| 2019/0324310 | A1* | 10/2019 | Kudo | G02F 1/13338 |
| 2021/0036071 | A1* | 2/2021 | Zhang | H01L 51/0096 |

* cited by examiner

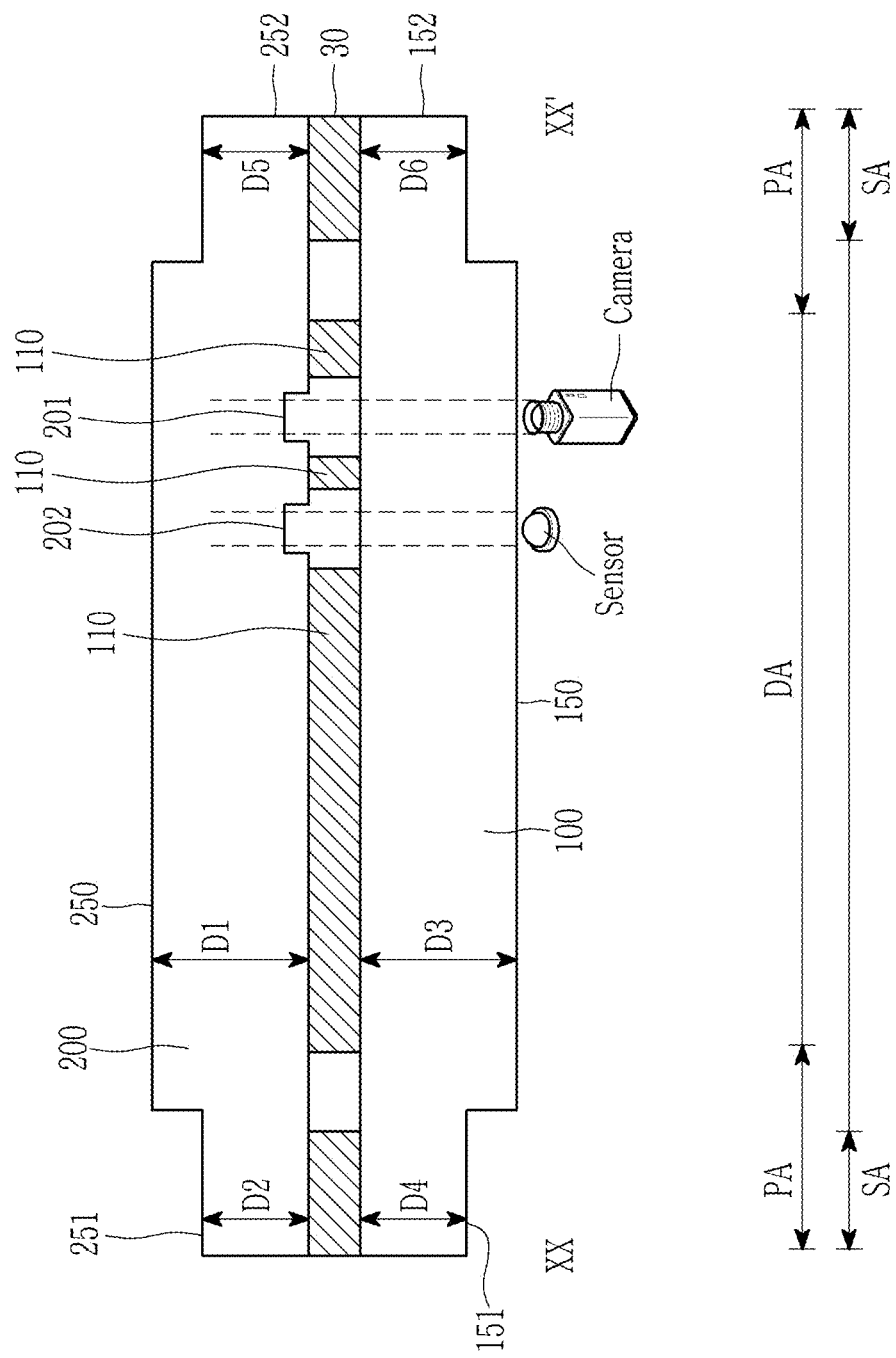

DISPLAY DEVICE AND MANUFACTURING METHOD THEREOF

CROSS-REFERENCE TO RELATED APPLICATION

This application claims priority to and the benefit of Korean Patent Application No. 10-2019-0101908 filed in the Korean Intellectual Property Office on Aug. 20, 2019, the entire contents of which are incorporated herein by reference.

BACKGROUND

1. Field

Embodiments of the present disclosure relate to a display device and a manufacturing method thereof.

2. Related Art

Display devices having various characteristics such as, for example, slimness, low power consumption, and a light weight are needed, and various displays such as, for example, liquid crystal displays and organic light emitting device displays are being developed.

Display devices are manufactured by disposing switching elements, such as, for example, thin film transistors; wires for connecting them; electrodes for applying voltages to display elements; and display elements for configuring red, green, and blue pixels, on a first substrate as a thin layer structure, and sealing a second substrate thereon.

The sealing process is performed by inserting a sealing portion made of a frit between the first substrate and the second substrate and hardening the frit.

However, if the thickness of the substrate is formed to be equal to or greater than about 0.3 t, then during a process for incising the display device for respective cells (e.g., display units), a stress gathers on a sealed unit on which the sealing portion is applied, and edges of the substrate may break. To minimize or reduce this occurrence, the display device is incised at a position separated from the sealing portion by more than a set or predetermined distance, which causes a dead space in an area in which no image is displayed (e.g., a non-display area) to inevitably widen.

The above information disclosed in this Background section is only for enhancing an understanding of the background of the present disclosure, and therefore it may contain information that is not in the related art that is already known to a person of ordinary skill in the related art.

SUMMARY

The present disclosure provides embodiments of a display device having a reduced dead space of a non-display area, and a manufacturing method thereof.

In embodiments of the present disclosure, a display device includes: a display area; a non-display area surrounding the display area and including a sealing area; a first substrate including a center portion including a portion in the display area and an external portion including a portion in the sealing area; a second substrate including a center portion including a portion in the display area and an external portion including a portion in the sealing area; and a sealing portion between the first substrate and the second substrate and in the sealing area, wherein a thickness of the center portion of the first substrate is different from a thickness of the external portion of the first substrate, and a thickness of the center portion of the second substrate is different from a thickness of the external portion of the second substrate.

In some embodiments, the thickness of the center portion of the first substrate may be greater than the thickness of the external portion of the first substrate.

In some embodiments, the thickness of the center portion of the first substrate may be from 0.3 t (0.3 mm) to 0.4 t (0.4 mm), and the thickness of the external portion of the first substrate may be equal to or less than 0.25 t (0.25 mm).

In some embodiments, the thickness of the center portion of the second substrate may be greater than the thickness of the external portion of the second substrate.

In some embodiments, the thickness of the center portion of the second substrate may be from 0.3 t (0.3 mm) to 0.4 t (0.4 mm), and the thickness of the external portion of the second substrate may be equal to or less than 0.25 t (0.25 mm).

In some embodiments, the external portion of the first substrate may include a first external portion and a second external portion on two opposite sides along a horizontal direction of the center portion of the first substrate, and the thickness of the first external portion of the first substrate may be different from the thickness of the second external portion of the first substrate.

In some embodiments, the external portion of the second substrate may include a first external portion and a second external portion on two opposite sides along a horizontal direction of the center portion of the second substrate, and the thickness of the first external portion of the second substrate may be different from the thickness of the second external portion of the second substrate.

In some embodiments, the first substrate and the second substrate may include a cutting line at the sealing area.

In some embodiments, the cutting line may be at a position that is separated toward the center portion from an edge of the external portion by 50 μm to 100 μm.

In some embodiments of the present disclosure, a display device includes: a display area; a non-display area surrounding the display area and including a sealing area; a first substrate including a center portion including a portion in the display area and an external portion including a portion in the sealing area; a second substrate including a center portion including a portion in the display area and an external portion including a portion in the sealing area; a sealing portion between the first substrate and the second substrate and in the sealing area; and an optical element on a lower side of the first substrate, wherein the center portion of the second substrate includes at least one recess portion on one side facing the first substrate, the optical element is at a portion corresponding to the recess portion, a thickness of the center portion of the first substrate is different from a thickness of the external portion of the first substrate, and a thickness of the center portion of the second substrate is different from a thickness of the external portion of the second substrate.

In some embodiments, each of the thicknesses of the center portions of the first substrate and the second substrate may be greater than each of the thicknesses of the external portions of the first substrate and the second substrate.

In some embodiments, each of the thicknesses of the center portions of the first substrate and the second substrate may be from 0.3 t (0.3 mm) to 0.4 t (0.4 mm), and each of the thicknesses of the external portions of the first substrate and the second substrate may be equal to or less than 0.25 t (0.25 mm).

In some embodiments, the external portion of the first substrate may include a first external portion and a second external portion on two opposite sides along a horizontal direction of the center portion of the first substrate, the external portion of the second substrate may include a first external portion and a second external portion on two opposite sides along a horizontal direction of the center portion of the second substrate, a thickness of the first external portion of the first substrate may be different from a thickness of the second external portion of the first substrate, and a thickness of the first external portion of the second substrate may be different from a thickness of the second external portion of the second substrate.

In some embodiments, each of the thicknesses of the first external portion of the first substrate, the second external portion of the first substrate, the first external portion of the second substrate, and the second external portion of the second substrate may be equal to or less than 0.25 mm.

In some embodiments, the first substrate and the second substrate may include a cutting line at the sealing area.

In some embodiments of the present disclosure, a method for manufacturing a display device includes: attaching a first acid-resistive film to an upper side of a substrate and a second acid-resistive film to a lower side of the substrate; disposing a first metal pattern portion onto a portion of the first acid-resistive film and a second metal pattern portion onto a portion of the second acid-resistive film; irradiating ultraviolet rays onto an upper side of an exposed portion of the first acid-resistive film where the first metal pattern portion is not on the first acid-resistive film and onto a lower side of an exposed portion of the second acid-resistive film where the second metal pattern portion is not on the second acid-resistive film; removing the exposed portion of the first acid-resistive film and the exposed portion of the second acid-resistive film; and etching a portion of the upper side of the substrate where the first acid-resistive film is removed, and etching a portion of the lower side of the substrate where the second acid-resistive film is removed, wherein an external portion of the substrate corresponds to the portion of the substrate where the first acid-resistive film is removed, and a recess portion of the substrate corresponds to the portion of the substrate where the second acid-resistive film is removed.

In some embodiments, the substrate may include a display area for displaying an image and a non-display area surrounding the display area, and the external portion of the substrate may be in the non-display area.

In some embodiments, a thickness of the external portion of the substrate may be formed to be equal to or less than 0.25 t (0.25 mm).

In some embodiments, the recess portion of the substrate may be formed in the display area.

In some embodiments, the substrate may be made of glass.

According to some of the exemplary embodiments, the external portion of the substrate is formed to be thinner than the center portion, and a process for cutting a cell (e.g., cutting to form a display unit) may be performed in the sealing area, thereby reducing the dead space on the substrate and reducing the expense for processing the external portion.

According to some embodiments, a set portion may be included to surround the external portion of the substrate, thereby realizing a slim display device.

According to some embodiments, the external portion of the substrate may be etched during a process for etching a recess portion in a light transmission area, thereby reducing the number of processing stages and improving productivity.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

FIG. 20 shows a cross-sectional view of a display device taken along line XX-XX' of FIG. 19.

DETAILED DESCRIPTION

Figure 1:
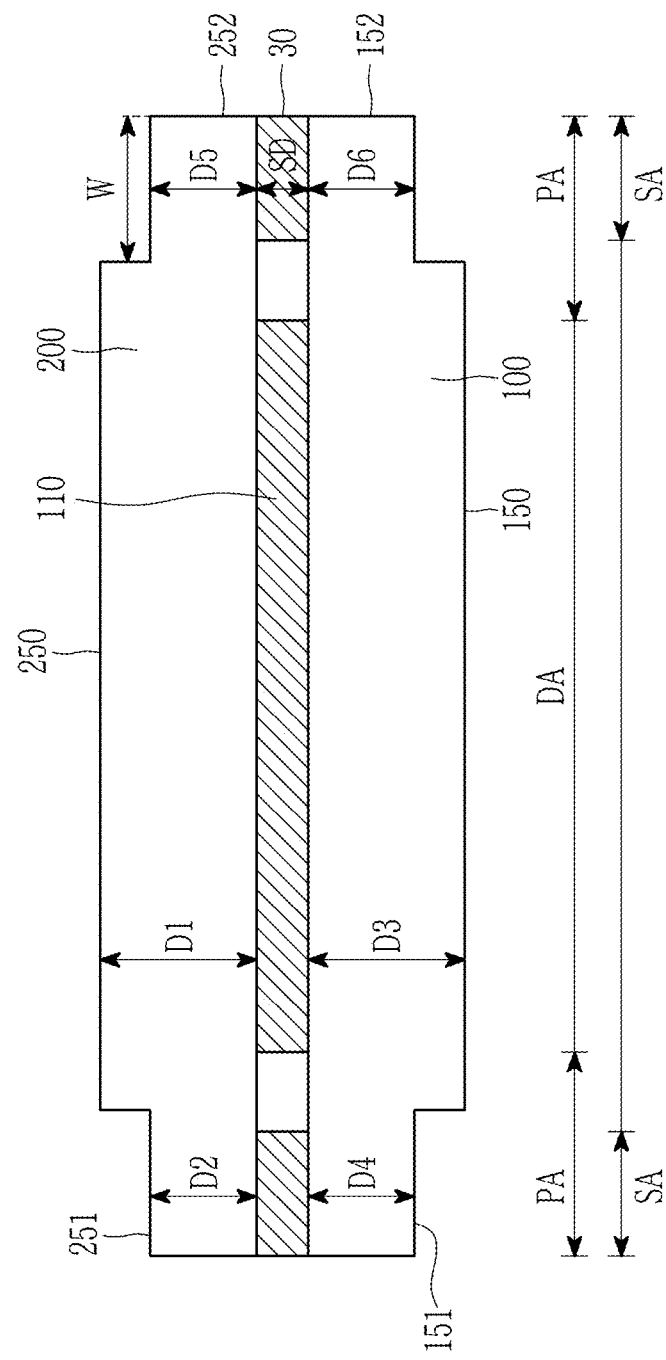
FIG. 1 shows a cross-sectional view of a display device according to an exemplary embodiment.

The subject matter of the present disclosure will be described more fully hereinafter with reference to the accompanying drawings, in which some exemplary embodiments of the present disclosure are shown. As those skilled in the art should realize, the described embodiments may be modified in various different ways, without departing from the spirit and scope of the present disclosure.

The drawings and descriptions are illustrative in nature and not restrictive, and like reference numerals designate like elements throughout the specification.

The size and thickness of each configuration (e.g., the relative sizes and thicknesses of features or elements) shown in the drawings may be exaggerated for better understanding and for ease of description, and embodiments of the present disclosure are not limited thereto. In the drawings, the thickness of layers, films, panels, areas, etc., may be exaggerated for clarity. For better understanding and ease of description, the thicknesses of some layers and areas may be exaggerated.

It will be understood that when an element such as, for example, a layer, film, area, or substrate is referred to as being "on" or "contacting" another element, it can be "directly on" or "directly contacting" the other element, or intervening elements may also be present. In contrast, when an element is referred to as being "directly on" or "directly contacting" another element, there are no intervening elements present. Further, in the specification, the word "on" may mean a position above or below the object portion, and does not necessarily mean a position on the upper side of the object portion (e.g., the upper side of the object portion based on a gravitational direction).

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items.

The phrase "on a plane" means viewing the object portion from the top, and the phrase "on a cross-section" means viewing a cross-section (e.g., a cross section obtained from vertically cutting the object portion) of the object portion.

A display device according to an exemplary embodiment will now be described with reference to FIG. 1.

FIG. 1 shows a cross-sectional view of a display device according to an exemplary embodiment.

Referring to FIG. 1, the display device includes a first substrate 100, a second substrate 200, and a sealing portion 30.

The first substrate 100 is on a lower side of the display device, and may include glass, quartz, and/or ceramic. A display element 110, which may include an organic light emitting diode (OLED), is on an upper side of the first substrate 100. The display element 110 is configured with (e.g., the display element 110 includes) a pixel circuit including a plurality of wires, a thin film transistor, a pixel electrode, and a common electrode, and an emitter, and the display element 110 may include a plurality of pixels for displaying images.

The first substrate 100 includes a center portion 150 with a same thickness D3 (e.g., with a uniform thickness D3), and a first external portion 151 and a second external portion 152 on both sides (e.g., on two opposite sides along a horizontal direction) of the center portion 150. The first external portion 151 and the second external portion 152 may be referred to as external portions. The first substrate 100 includes an area that is divided into a display area (DA), in which the display element 110 is located to display an image, and a non-display area (PA) surrounding the display area (DA). The non-display area (PA) includes a sealing area (SA) in which a sealing portion 30 is located.

The center portion 150 of the first substrate 100 includes a portion or all of the display area (DA) and a portion of the non-display area (PA), and the external portions 151 and 152 of the first substrate 100 include a portion of the non-display area (PA), including the sealing area (SA).

For example, in some embodiments, the display device may include a display area (DA) and a non-display area (PA) surrounding the display area (DA), and the non-display area (PA) may include a sealing area (SA). In some embodiments, the center portion 150 of the first substrate 100 may include a first portion that overlaps the display element 110, and the first portion may be in the display area (DA) (e.g., may overlap the display area (DA)). In some embodiments, the external portions 151 and 152 of the first substrate 100 may include a second portion that overlaps the sealing portion 30, and the second portion may be in the sealing area (SA) (e.g., may overlap the sealing area (SA)). In some embodiments, a portion of the non-display area (PA) may overlap a portion of the center portion 150, and another portion of the non-display area (PA) may overlap a portion of the external portions 151 and 152.

The center portion 150 of the first substrate 100 has a different thickness than thicknesses of the external portions 151 and 152 of the first substrate 100. In some embodiments, a thickness D3 of the center portion 150 of the first substrate 100 is greater than thicknesses D4 and D6 of the external portions 151 and 152, respectively, of the first substrate 100. In some exemplary embodiments, the thickness D3 of the center portion 150 of the first substrate 100 is from 0.3 t to 0.4 t, and the thicknesses D4 and D6 of the external portions 151 and 152, respectively, of the first substrate 100 are equal to or less than 0.25 t. In some embodiments, the thickness D4 of the first external portion 151 may be the same or substantially the same as, or different from, the thickness D6 of the second external portion 152.

Each of the external portions 151 and 152 of the first substrate 100 is generated by etching an edge of the first substrate 100. A stage (e.g., a process) for forming an external portion will be described in more detail herein below with reference to FIG. 5 to FIG. 10.

The second substrate 200 is at a top of the display device and faces the first substrate 100. The second substrate 200 may include glass, quartz, and/or ceramic. In some embodiments, the second substrate 200 seals the display element 110, which may include an organic light emitting element (OLED). The second substrate 200 may have a same or substantially the same size (e.g., thickness) as the first substrate 100, and edges of the first substrate 100 and the second substrate 200 may be parallel to each other (e.g., may be aligned with each other).

The second substrate 200 includes a center portion 250 with a same thickness (e.g., with a uniform thickness). The second substrate 200 includes a first external portion 251 and a second external portion 252 on both sides (e.g., on two opposite sides along a horizontal direction) of the center portion 250. The first external portion 251 and the second external portion 252 may be referred to as external portions. The second substrate 200 includes an area divided into a display area (DA), in which a display element 110 is arranged to display an image, and a non-display area (PA) surrounding the display area (DA). The non-display area (PA) includes a sealing area (SA), in which a sealing portion 30 is arranged.

The center portion 250 of the second substrate 200 includes a portion or all of the display area (DA) and a portion of the non-display area (PA), and the external portions 251 and 252 of the second substrate 200 include a portion of the non-display area (PA), including the sealing area (SA).

For example, in some embodiments, the display device may include a display area (DA) and a non-display area (PA) surrounding the display area (DA), and the non-display area (PA) may include a sealing area (SA). In some embodiments, the center portion 250 of the second substrate 200 may include a first portion that overlaps the display element 110, and the first portion may be in the display area (DA) (e.g., may overlap the display area (DA)). In some embodiments, the external portions 251 and 252 of the second substrate 200 may include a second portion that overlaps the sealing portion 30, and the second portion may be in the sealing area (SA) (e.g., may overlap the sealing area (SA)). In some embodiments, a portion of the non-display area (PA) may overlap a portion of the center portion 250, and another portion of the non-display area (PA) may overlap a portion of each of the external portions 251 and 252.

The center portion 250 of the second substrate 200 has a different thickness than thicknesses of the external portions 251 and 252 of the second substrate 200. In some embodiments, the thickness D1 of the center portion 250 of the second substrate 200 is greater than the thicknesses D2 and D5 of the external portions 251 and 252, respectively, of the second substrate 200. In some exemplary embodiments, the thickness D1 of the center portion 250 of the second substrate 200 is from 0.3 t to 0.4 t, and the thicknesses D2 and D5 of the external portions 251 and 252, respectively, of the second substrate 200 are equal to or less than 0.25 t. In some embodiments, the thickness D2 of the first external portion 251 may be the same as, or different from, the thickness D5 of the second external portion 252. As used herein, the term (t) represents a distance unit, and, for example, 1 t corresponds to 1 millimeter (1 mm=$10^{-3}$ m).

The center portion 150 of the first substrate 100 and the center portion 250 of the second substrate 200 overlap the display element 110, and the external portions 151 and 152 of the first substrate 100 and the external portions 251 and 252 of the second substrate 200 overlap a sealing portion 30. The first external portion 151 and the second external portion 152 of the first substrate 100, and the first external portion 251 and the second external portion 252 of the second substrate 200 may each have a same or different thickness, and the thickness of each may be within the range of equal to or less than 0.25 t.

The sealing portion 30 is between the first substrate 100 and the second substrate 200, and it is in the sealing area (SA). The sealing portion 30 is separated from the display element 110, and it is within a width (W) of the external portions 151, 152, 251, and 252 of the first substrate 100 and the second substrate 200. The widths (W) of the external portions 151, 152, 251, and 252 may be equal to or greater than 650 μm when determined with (e.g., defined by) a length measured toward the center portions 150 and 250 from the edges of the first substrate 100 and the second substrate 200. Accordingly, the sealing portion 30 may be in the area within 650 μm toward the center portions 150 and 250 from the edges of the first substrate 100 and the second substrate 200. The sealing portion 30 may include various materials such as, for example, a frit and/or an anisotropic conductive film (ACF), and it may have a thickness (SD) of 0.005 t to bond the first substrate 100 and the second substrate 200.

A process, according to some exemplary embodiments, for incising the first substrate 100 and the second substrate 200 bonded by the sealing portion 30 by respective cells (e.g., display units) in a display device will now be described with reference to FIG. 2 and FIG. 3.

Figure 2:
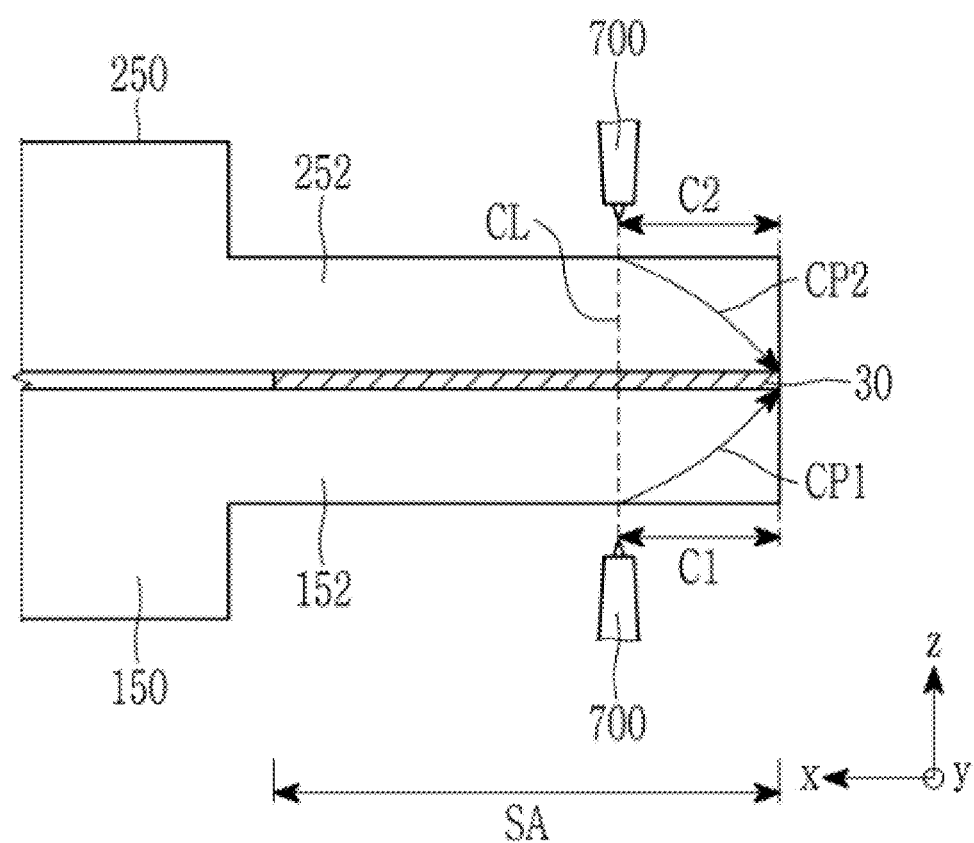
FIG. 2 shows an edge portion of a display device according to an exemplary embodiment.
Figure 3:
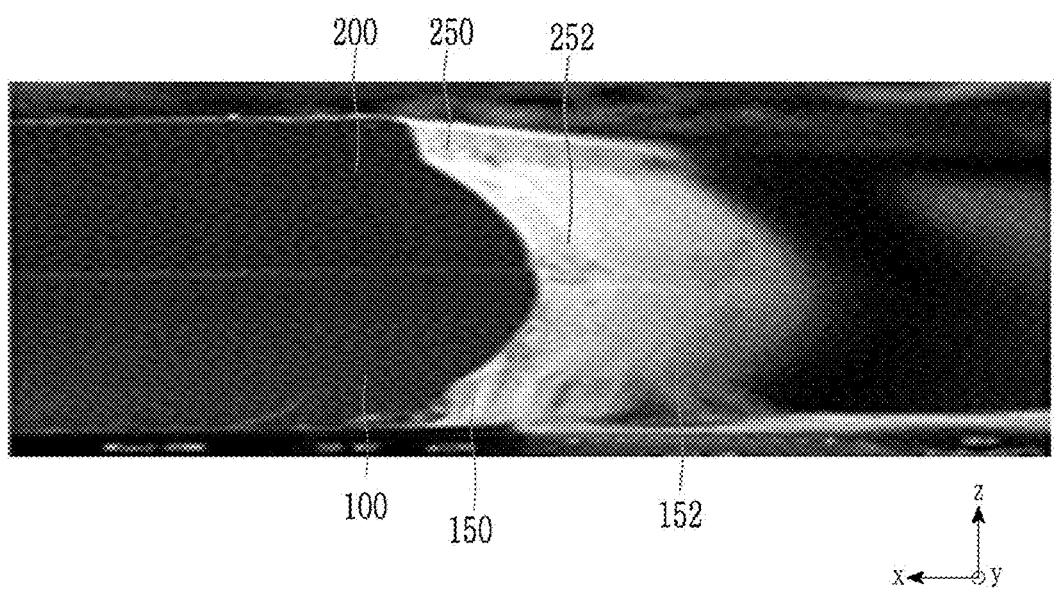
FIG. 3 shows an image of an edge portion of a display device incised along a cutting line in the display device according to the exemplary embodiment of FIG. 2.

FIG. 2 shows an edge portion of a display device according to some exemplary embodiments, and FIG. 3 shows an image of an edge of a display device incised along a cutting line in the display device, according to some exemplary embodiments of FIG. 2.

Referring to FIG. 2, a cutting wheel 700 is provided at a cutting line CL in the sealing area (SA). In more detail, the cutting wheel 700 is provided at the cutting line CL on the external portion 152 of the first substrate 100 and on the external portion 252 of the second substrate 200.

The cutting line CL of the first substrate 100 and the cutting line CL of the second substrate 200 is a virtual line extending in a vertical direction. For example, the cutting line CL is a virtual line extending in a vertical direction from an upper side of the external portion 252 of the second substrate 200 to the lower side of the external portion 152 of the first substrate 100. On the first substrate 100 and the second substrate 200, the cutting line CL may be at a position (e.g., location) separated toward the center portions 150 and 250 from the edges of the first substrate 100 and the second substrate 200 by 50 μm to 100 μm. In some embodiments, the cutting line CL may be at a position (e.g., location) separated toward the center portions 150 and 250 from the edges of the substrates 100 and 200 by 60 μm. The position of the cutting line CL may be referred to as a cutting margin.

The cutting wheel 700 provided at the cutting line CL of the first substrate 100 cuts the first substrate 100 in a thickness direction from the surface (e.g., the lower side) of the first substrate 100 through ½ (one half) of the sealing portion 30. The cutting wheel 700 provided at the cutting line CL of the second substrate 200 cuts the second substrate 200 in the thickness direction from the surface (e.g., the upper side) of the second substrate 200 through ½ of the sealing portion 30.

For example, in some embodiments, the cutting wheel 700 cuts the first substrate 100 along a first cutting path CP1 to provide a curved edge of the display device. In some embodiments, the first cutting path CP1 begins at the lower side of the first substrate 100 at the cutting line CL, traverses along a vertical direction (e.g., a Z-axis direction) through the first external portion 152 of the first substrate 100 and ½ of the sealing portion 30, and also traverses (e.g., simultaneously traverses) along a horizontal direction (e.g., along a direction opposite to the X-axis direction) through a first horizontal distance C1 to the edge of the display device. In some embodiments, the cutting wheel 700 may cut the second substrate 200 along a second cutting path CP2 to provide a curved edge of the display device. The second cutting path CP2 begins at the upper side of the second substrate 200 at the cutting line CL, traverses along a vertical direction (e.g., along a direction opposite to the Z-axis direction) through the second external portion 252 of the second substrate 200 and ½ of the sealing portion 30, and also traverses (e.g., simultaneously traverses) along a horizontal direction (e.g., along a direction opposite to the X-axis direction) through a second horizontal distance C2 to the edge of the display device. The first horizontal distance C1 may be the same or substantially the same as the second horizontal distance C2, or the first and second horizontal distances C1 and C2 may be different.

The cutting wheel 700, according to some exemplary embodiments, may be more efficiently applied (e.g., used) when the thickness of the substrate (e.g., the thickness of each of the external portions 151, 152, 251, and 252 of the first and second substrates 100 and 200) is equal to or less than 0.25 t. Therefore, the method of manufacturing the display device according to some exemplary embodiments may include a cell cutting process (e.g., cutting to form a display unit) by the cutting wheel as (e.g., after) the external portion of the substrate is formed (e.g., has been formed) to have a thickness of equal to or less than 0.25 t. In some embodiments, the cell cutting process may be performed in the sealing area (SA), thereby reducing the dead space of the substrate and reducing the cost of processing the external portion.

Referring to FIG. 3, the cross-sectional cut by the cutting wheel 700 shown in FIG. 2 is illustrated. The edges of the first substrate 100 and of the second substrate 200 have curved shapes in a cross-sectional view. The first substrate 100 and the second substrate 200 may be integrally (e.g., collectively) referred to as a substrate. FIG. 3 is a photographed image of the edge of the substrate in an inclined way in an xy direction. An edge of the incised substrate is photographed in white, the left portion is photographed in black as a cross-section of the incised substrate, and the right portion is photographed in a gradually thickening shadow as an extending portion of the cross-section of the substrate.

A curved portion of the upper side of the portion photographed in white represents the center portion 250 of the second substrate 200, and a portion inclined towards a bottom and connected to the center portion 250 represents the external portion 252 of the second substrate 200. A curved portion of the lower side of the portion photographed in white represents the center portion 150 of the first substrate 100, and a portion inclined towards a top and connected to the center portion 150 represents the external portion 152 of the first substrate 100.

A display device, according to some embodiments, including a set portion will now be described with reference to FIG. 4.

Figure 4:
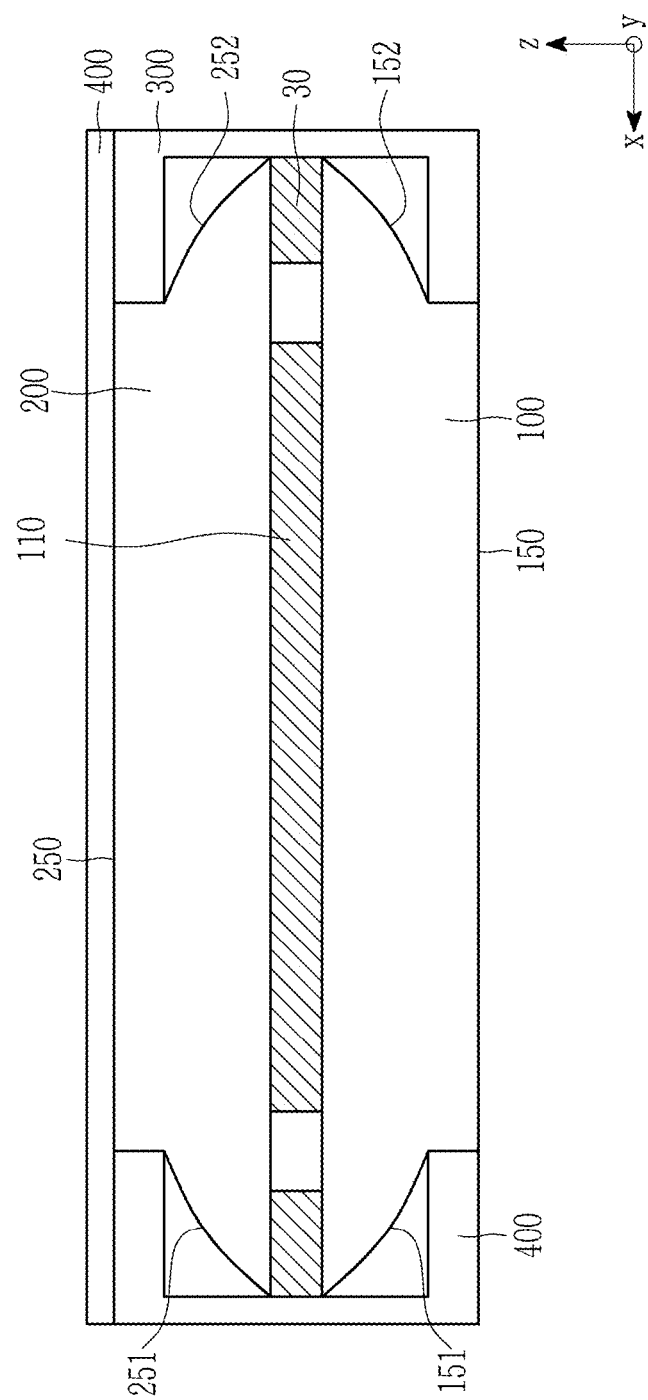
FIG. 4 shows a cross-sectional view of a display device according to an exemplary embodiment.

FIG. 4 shows a cross-sectional view of a display device according to some exemplary embodiments.

Referring to FIG. 4, the display device according to some exemplary embodiments includes a first substrate 100, a second substrate 200, a sealing portion 30, a set portion 300, and a window 400. In some embodiments of FIG. 4, the configuration of the first substrate 100, the sealing portion 30, and the second substrate 200 in the display device correspond to the description provided with reference to FIG. 1, and redundant descriptions will not be provided.

The external portions 151 and 152 of the first substrate 100 include curved shapes in a cross-sectional view, which are formed by the cell cutting process (e.g., cutting to form a display unit). The external portions 251 and 252 of the second substrate 200 include curved shapes in a cross-sectional view, which are formed by the cell cutting process.

The set portion 300 surrounds (e.g., covers) the external portions 151 and 152 of the first substrate 100 and the external portions 251 and 252 of the second substrate 200. An upper side of the set portion 300 is in the same line as (e.g., is aligned with) the upper side of the center portion 250 of the second substrate 200. The set portion 300 is a frame to protect the substrates 100 and 200, and it may have a '⊏' shape or an inverse '⊐' shape (e.g., a c-shape or an inverse c-shape). An internal side of the set portion 300 contacts an external side (e.g., a side corresponding to the edge of the display device) of the sealing portion 30, and the set portion 300 may be fixed to the sides of the substrates 100 and 200. The set portion 300 may be fixed to the sealing portion 30 by an adhesive between the internal side of the set portion 300 and the external side of the sealing portion 30.

The window 400 is on the upper sides of the set portion 300 and the second substrate 200. The window 400 protects various configurations and components thereunder. The window 400 includes a transparent material to transmit internal light from inside the display device to the outside.

The external portion of the substrate may be thinner than the center portion. Accordingly, in some exemplary embodiments, the set portion 300 wraps (e.g., covers) the external portion of the substrate, and the upper side of the set portion 300 is in the same line as (e.g., is aligned with) the center portion of the substrate, thereby realizing a slim display device.

A process for manufacturing a substrate according to some exemplary embodiments will now be described with reference to FIG. 5 to FIG. 10.

FIG. 5 to FIG. 10 show cross-sectional views of a method for manufacturing a display device according to some exemplary embodiments.

Figure 5:
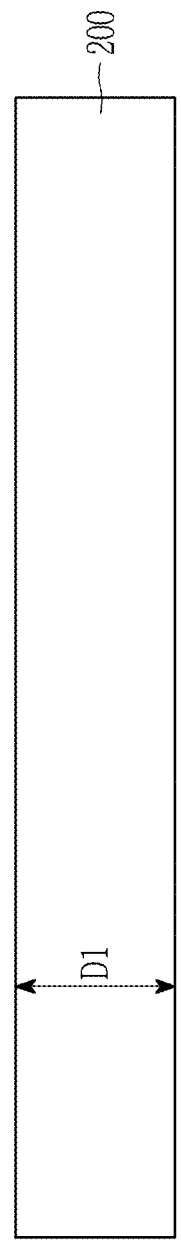
FIG. 5 to FIG. 10 show cross-sectional views of a method for manufacturing a display device according to an exemplary embodiment.

FIG. 5 shows a stage for preparing a substrate 200.

Referring to FIG. 5, a substrate 200 made of any other suitable material, such as, for example, glass, is prepared. The thickness D1 of the substrate 200 may be from 0.3 t to 0.4 t, and it may include a center portion and an external portion on both sides (e.g., on two opposite sides along a horizontal direction) of the center portion. In FIG. 5, the substrate 200 is shown to be the second substrate 200, but the first substrate 100 shown in FIG. 1 to FIG. 4 may be manufactured according to the same manufacturing method.

Figure 6:
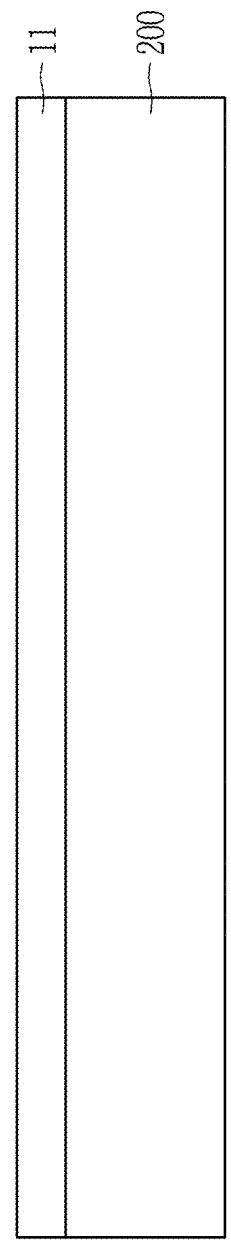

FIG. 6 shows a stage for attaching an acid-resistive film 11.

Referring to FIG. 6, an acid-resistive film 11 is attached to the substrate 200 (e.g., to the upper side of the substrate 200). The acid-resistive film 11 is a protection film for etching, and it includes an acid-resistive material that does not react to a strong acid or a hydrofluoric acid. The term "strong acid" may have the same meaning as generally understood by those of ordinary skill in the art. For example, the term "strong acid" may refer to hydrochloric acid, nitric acid, sulfuric acid, hydrobromic acid, hydroiodic acid, perchloric acid, and/or chloric acid. The thickness of the acid-resistive film 11 may be formed to be about 0.05 t, and it may be configured (e.g., formed) to be a dual layer including an adhesive layer and a protection layer. The adhesive layer of the acid-resistive film 11 may be provided between the protection layer and the substrate 200, and the protection layer may be provided on the adhesive layer.

Figure 7:
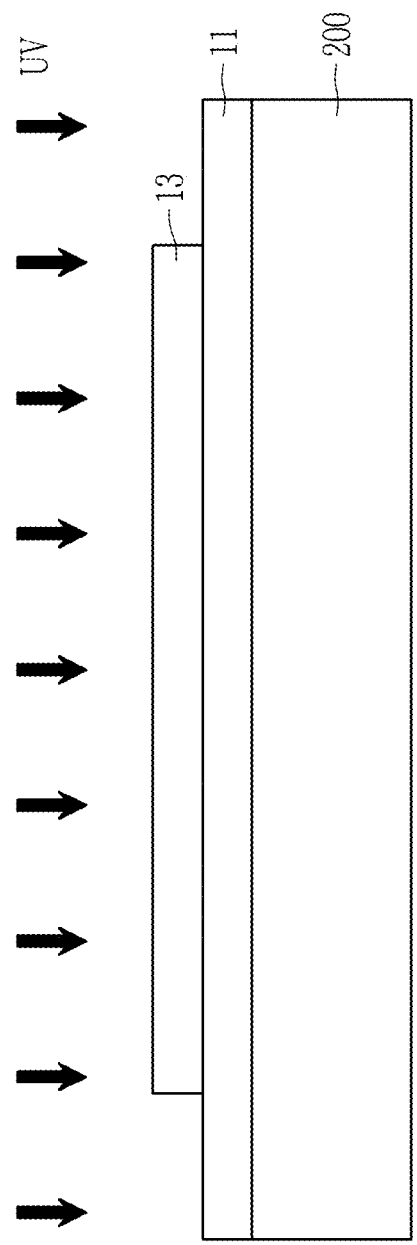

FIG. 7 shows a stage for irradiating ultraviolet rays (UV) onto the substrate 200.

Referring to FIG. 7, a metal pattern portion 13 is provided on the acid-resistive film 11, and is irradiated with ultraviolet rays (UV). The metal pattern portion 13 is provided at a location overlapping the center portion of the substrate 200. A portion of the acid-resistive film 11 at which the metal pattern portion 13 does not overlap the acid-resistive film 11 (e.g., the portion at which the acid-resistive film 11 is exposed) represents a portion overlapping the external portion of the substrate 200. The exposed portion of the acid-resistive film 11 may be exposed to (e.g., irradiated with) the ultraviolet rays (UV) and may be transformed into a state that may be peeled off by a suitable process.

Figure 8:
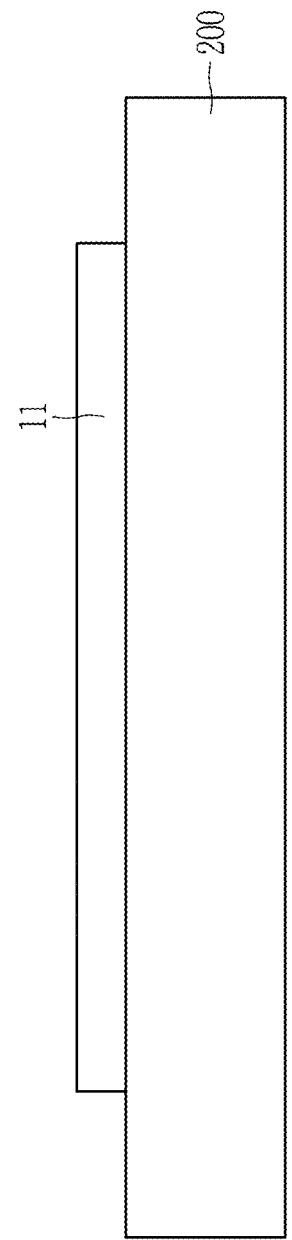

FIG. 8 shows a stage for removing a portion of the acid-resistive film 11.

Referring to FIG. 8, the portion of the acid-resistive film 11 that was exposed to the ultraviolet rays (UV) is removed. The remaining portion of acid-resistive film 11 is at the center portion of the substrate 200. The portion of the substrate 200 where the acid-resistive film 11 is on the upper side of the substrate 200 may be protected from a strong acid or a hydrofluoric acid by the acid-resistive film 11. However, the portion of the substrate 200 at which the acid-resistive film 11 is not on the upper side of the substrate 200 (e.g., the exposed portion of the substrate 200) may be etched by an etchant including a strong acid or a hydrofluoric acid.

Figure 9:
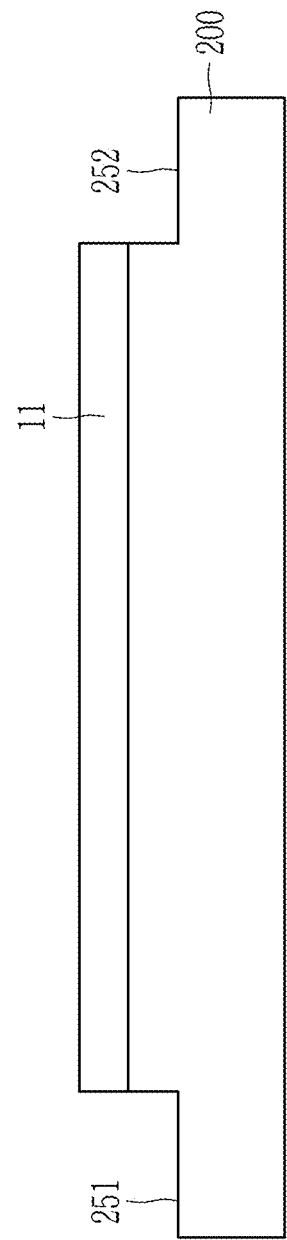

FIG. 9 shows a stage for etching a portion of the substrate 200.

Referring to FIG. 9, external portions 251 and 252 are formed by etching the exposed portion of the substrate 200. The external portions 251 and 252 may be formed by a wet etching process. The wet etching process represents a process for etching the exposed portion of the substrate 200 at which the acid-resistive film 11 is not on (e.g., not attached) by using an etchant that may include hydrogen fluoride (HF). In some embodiments, the portion of the substrate 200 corresponding to the external portions 251 and 252 of the substrate 200 may be etched to a depth that is equal to or greater than 0.15 t. Therefore, the portion of the substrate 200 corresponding to the external portions 251 and 252 of the substrate 200 may be formed to have a thickness that is from about 0.15 t to 0.25 t. The external portions 251 and 252 on both sides (e.g., on two opposite sides along a horizontal direction) of the center portion 250 may be etched to different depths according to (e.g., caused by) processing errors.

Figure 10:
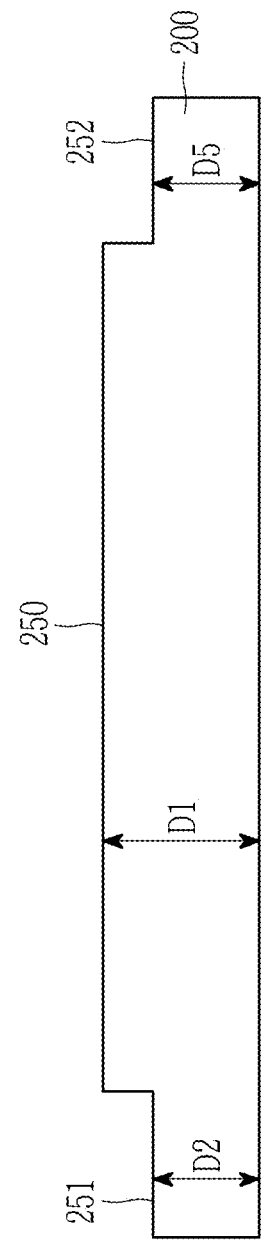

FIG. 10 shows a second substrate 200 according to some exemplary embodiments.

Referring to FIG. 10, the acid-resistive film 11 at the center portion 250 is removed after the etching process described with reference to FIG. 9. Accordingly, the substrate 200 may be formed, wherein the thickness D1 of the center portion 250 may be from 0.3 t to 0.4 t, and the thicknesses D2 and D5 of the external portions 251 and 252, respectively, may be equal to or less than 0.25 t.

The display device according to some exemplary embodiments may include the first substrate 100 including a center portion 150 and an external portion 151 and 152, and the first substrate 100 and second substrate 200 may be bonded to each other by a sealing portion 30, as shown in FIG. 1. Accordingly, each of the first substrate 100 and the second substrate 200 are respectively formed to have a thickness D4, D6, D2, and D5 of the external portion 151, 152, 251, and 252, respectively, that is equal to or less than 0.25 t, so that the cell cutting process (e.g., cutting to form a display unit) may be performed by the cutting wheel 700.

A display device according to some exemplary embodiments will now be described with reference to FIG. 11 and FIG. 12.

Figure 11:
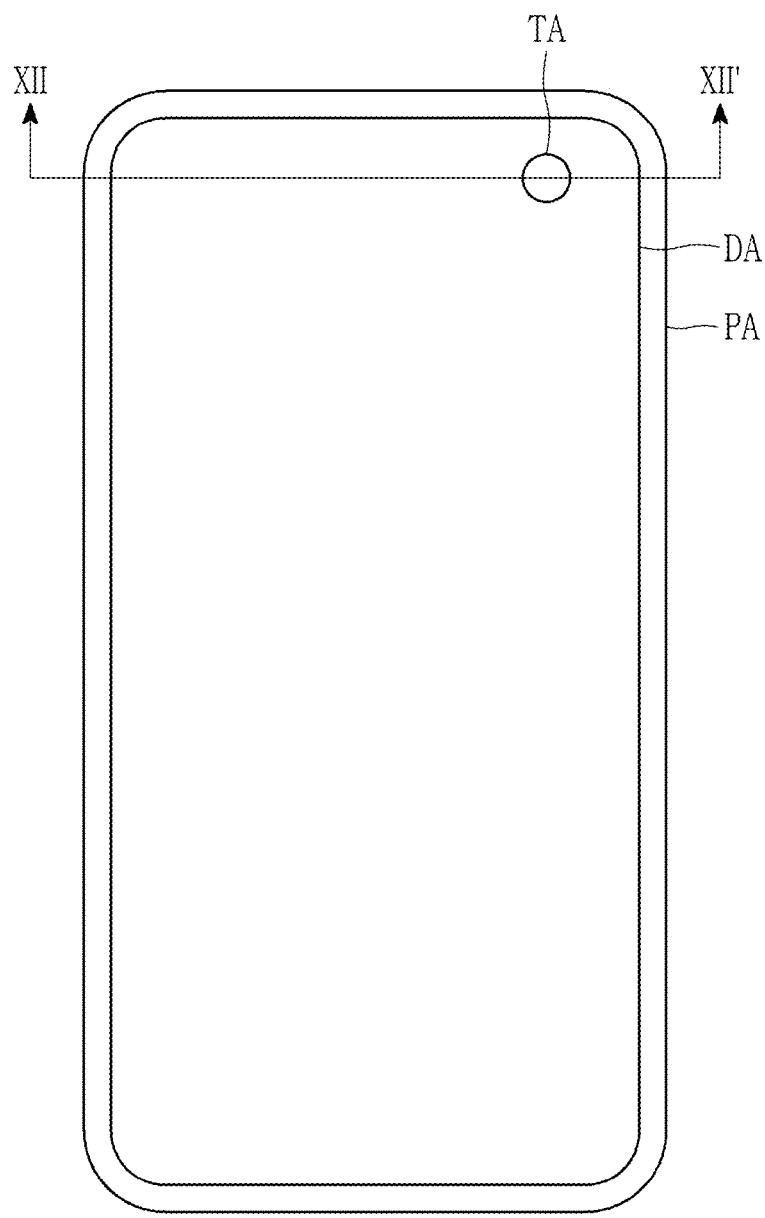
FIG. 11 shows a plan view of a display device according to an exemplary embodiment.
Figure 12:
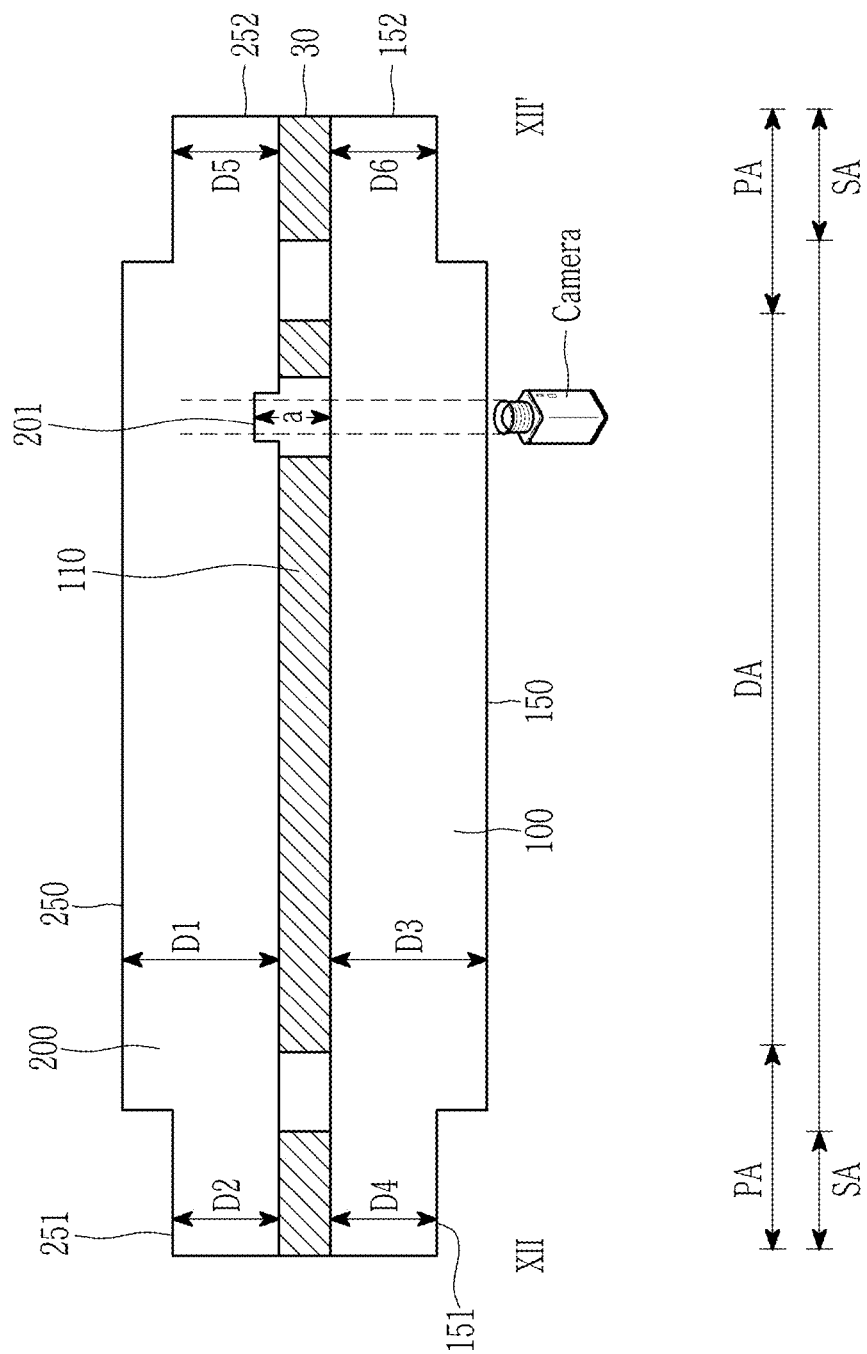
FIG. 12 shows a cross-sectional view of a display device taken along line XII-XII' of FIG. 11.

FIG. 11 shows a display device according to some exemplary embodiments, and FIG. 12 shows a cross-sectional view of a display device taken along line XII-XII' of FIG. 11. Regarding the display device according to some exemplary embodiments of FIG. 12, some configurations of the first substrate 100, the sealing portion 30, and the second substrate 200 correspond to some of the configurations described with reference to FIG. 1, and redundant descriptions will not be provided.

Referring to FIG. 11, the display device according to some exemplary embodiments includes a display area (DA) occupying a majority of a front side (e.g., upper side) of the display device, a non-display area (PA) that is a peripheral area surrounding the display area (DA), and a light transmission area (TA) in the display area (DA) to transmit light.

The display device according to some exemplary embodiments may include at least one optical element in the light transmission area (TA). The optical element may be any suitable optical element, such as, for example, a camera, a flash, or a sensor.

Referring to FIG. 12, the display device according to some exemplary embodiments includes a first substrate 100, a second substrate 200, and a sealing portion 30.

The second substrate 200 may include glass, quartz, and/or ceramic, and it faces the first substrate 100. The center portion 250 of the second substrate 200 includes a recess portion 201 on one side (e.g., on a lower side side) facing the first substrate 100.

The recess portion 201 represents a portion corresponding to the light transmission area (TA) of FIG. 11. The display element 110 is not at the portion corresponding to the recess portion 201, and an optical element (e.g., camera) is on the lower side of the first substrate 100. The optical element (e.g., camera) may be closely attached to the lower side of the first substrate 100 so as to increase transmittance. In some embodiments, because the recess portion 201 may transmit light as it is (e.g., without modification), a width of the recess portion 201 may be determined with consideration of refraction of light, according to a size of the optical element (e.g., camera).

Because the recess portion 201 represents an etched portion on the lower side of the second substrate 200 facing the first substrate 100, it may be formed (e.g., simultaneously formed) during the process of etching the external portions 251 and 252 of the second substrate 200, or it may be formed during an additional etching process separate from (e.g., after) the process for etching the external portions 251 and 252. The process for etching the external portions 251 and 252 of the second substrate 200 corresponds to the manufacturing method described with reference to FIG. 5 to FIG. 10. A process for etching (e.g., simultaneously etching) a recess portion and an external portion will be described in more detail herein below with reference to FIG. 13 to FIG. 18.

A distance (a) between one side (e.g., an upper side) of the recess portion 201 and one side (e.g., an upper side) of the first substrate 100 facing the one side of the recess portion 201 may be maintained at equal to or greater than about 15 μm. For example, the distance (a) may be equal to or greater than about 15 μm. Accordingly, the recess portion 201 may transmit light that is input from the optical element (e.g., camera) without blurring (e.g., without the image formed by the transmitted light being blurred or substantially blurred) when an air gap is formed between the recess portion 201 (e.g., the upper side of the recess portion 201) and one side (e.g., the upper side) of the first substrate 100 facing the same.

It is shown in some exemplary embodiments that the display element 110 is not on one side (e.g., the upper side) of the first substrate 100 overlapping the recess portion 201. In some embodiments, a portion of the display element 110 may be on a portion of one side (e.g., the upper side) of the first substrate 100 overlapping the recess portion 201.

A method for manufacturing a substrate of a display device according to some exemplary embodiments will now be described with reference to FIG. 13 to FIG. 18.

FIG. 13 to FIG. 18 show cross-sectional views of a method for manufacturing a display device according to some exemplary embodiments.

Figure 13:
FIG. 13 to FIG. 18 show cross-sectional views of a method for manufacturing a display device according to an exemplary embodiment.

FIG. 13 shows a stage for preparing a substrate 200.

Referring to FIG. 13, a substrate 200 made of any suitable material, such as, for example, glass is prepared. The thickness D1 of the substrate 200 may be from 0.3 t to 0.4 t, and it may include a center portion and external portions on both sides (e.g., on two opposite sides along a horizontal direction) of the center portion.

Figure 14:
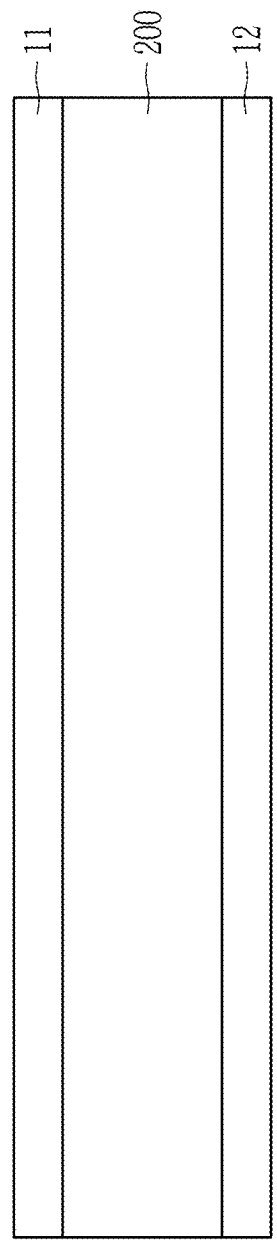

FIG. 14 shows a stage for attaching acid-resistive films 11 and 12. The acid-resistive films 11 and 12 are protection films for etching, include acid-resistive materials that do not react to a strong acid or a hydrofluoric acid, and include a first acid-resistive film 11 and a second acid-resistive film 12.

Referring to FIG. 14, the first acid-resistive film 11 is attached to the upper side of the substrate 200, and the second acid-resistive film 12 is attached to the lower side of the substrate 200. The first acid-resistive film 11 and the second acid-resistive film 12 may be concurrently (e.g., simultaneously) or sequentially attached to the upper side and lower side of the substrate 200. The thicknesses of the acid-resistive films 11 and 12 may be formed to be about 0.05 t, and the acid-resistive films 11 and 12 may each be configured to be (e.g., may each include) a dual layer including an adhesive layer and a protection layer. Accordingly, the adhesive layer of the first acid-resistive film 11 may be provided between the upper side of the substrate 200 and the protection layer of the first acid-resistive film 11. The adhesive layer of the second acid-resistive film 12 may be provided between the lower side of the substrate 200 and the protection layer of the second acid-resistive film 12. When a photoresist is used, rather than the acid-resistive film, photoresists made of a liquid may melt down when applied to the upper and lower sides of the substrate 200. Therefore, photoresists made of a liquid are not appropriate for performing an etching process on the upper side and the lower side of the substrate 200. Therefore, in some exemplary embodiments, the etching process may be more easily performed on the upper side and the lower side of the substrate 200 by attaching the acid-resistive films 11 and 12 to the upper and lower sides of the substrate 200.

Figure 15:
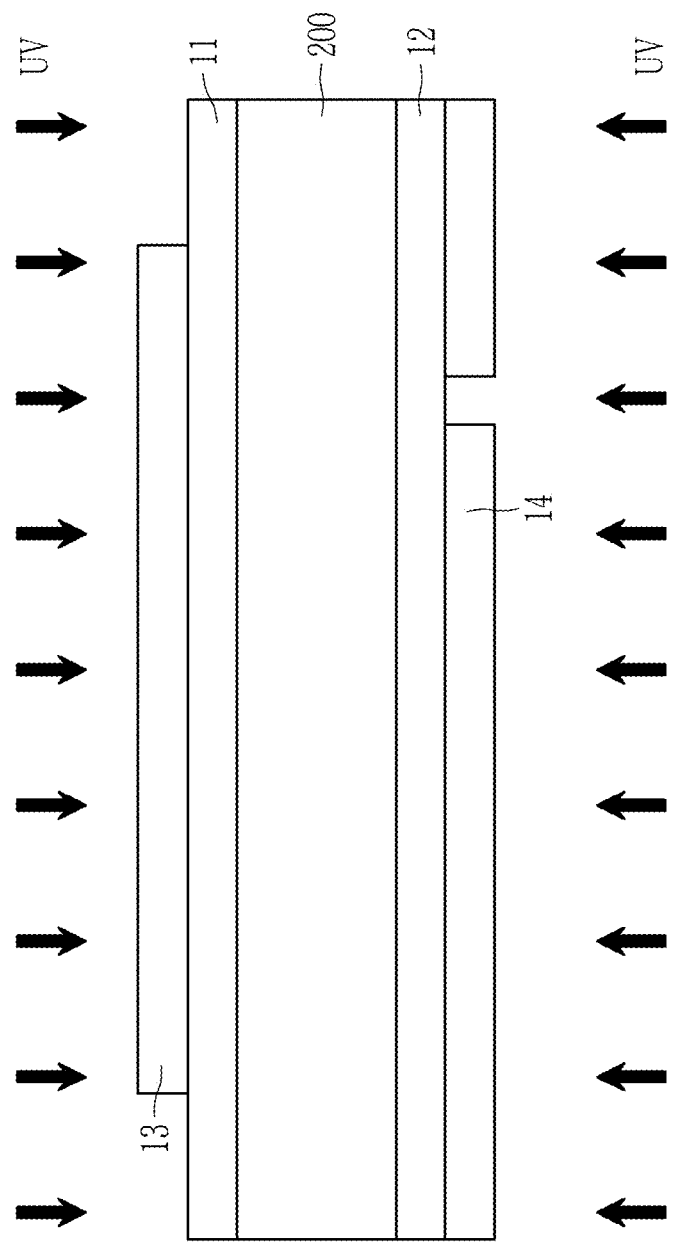

FIG. 15 shows a stage for irradiating ultraviolet rays onto the substrate 200.

Referring to FIG. 15, a first metal pattern portion 13 is provided on the first acid-resistive film 11, and ultraviolet rays (UV) are irradiated onto the upper side of the substrate 200 (e.g., onto the upper side of the first metal pattern portion 13 and onto the upper side of the exposed first acid-resistive film 11). In some embodiments, a second metal pattern portion 14 is provided on the second acid-resistive film 12, and ultraviolet rays (UV) are irradiated onto the lower side of the substrate 200 (e.g., onto the lower side of the second metal pattern portion 14 and onto the lower side of the exposed second acid-resistive film 12). In some embodiments, the upper side of the second metal pattern portion 14 directly contacts a portion of the second acid-resistive film 12.

The first metal pattern portion 13 is provided at a position overlapping the center portion of the substrate 200. The portion at which the first metal pattern portion 13 does not overlap the first acid-resistive film 11 represents a portion overlapping the external portion of the substrate 200. The second metal pattern portion 14 is provided at a portion overlapping the lower side of the substrate 200 excluding the recess portion 201 formed in the substrate 200 (e.g., to be formed in the substrate 200). A portion at which the second metal pattern portion 14 does not overlap the second acid-resistive film 12 represents a portion at which the recess portion 201 will be formed when the lower side of the substrate 200 is etched. An exposed portion of each of the acid-resistive films 11 and 12 may be exposed to the ultraviolet rays (UV) (e.g., may be irradiated by the ultraviolet rays (UV)), and may be transformed into a state that may be peeled off by a suitable process.

Figure 16:
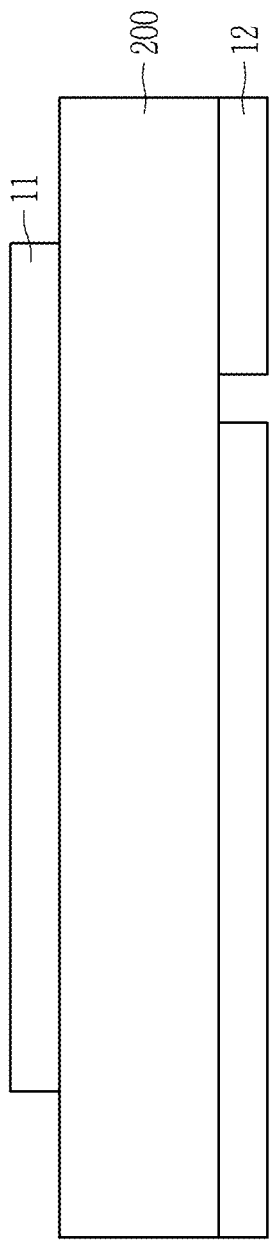

FIG. 16 shows a stage for removing a portion of each of the first acid-resistive film 11 and the second acid-resistive film 12.

Referring to FIG. 16, the portion of the first acid-resistive film 11 on the upper side of the substrate 200 that was exposed to the ultraviolet rays (UV) is removed. The remaining portion of the first acid-resistive film 11 is at the center portion of the substrate 200, and the center portion may be protected from the strong acid or the hydrofluoric acid by the first acid-resistive film 11.

The portion of the second acid-resistive film 12 on the lower side of the substrate 200 that was exposed to the ultraviolet rays (UV) is removed. The remaining portion of the second acid-resistive film 12 overlaps the lower side of the substrate 200 excluding the recess portion 201 formed in (e.g., to be formed in) the substrate 200, and the portion of the lower side of the substrate 200 that overlaps the remaining portion of the second acid-resistive film 12 may be protected from the strong acid or the hydrofluoric acid by the second acid-resistive film 12.

Figure 17:
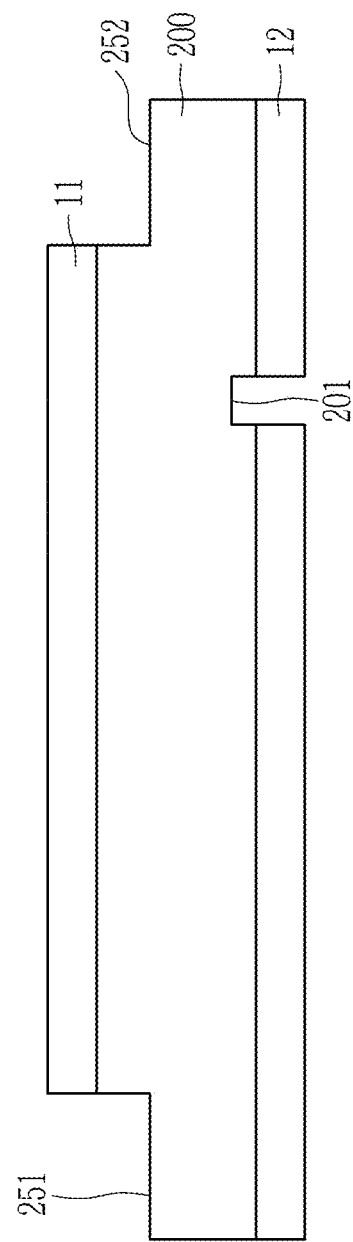

FIG. 17 shows a stage for etching the substrate 200.

Referring to FIG. 17, external portions 251 and 252 are formed by etching the exposed portion of the upper side of the substrate 200 at which the first acid-resistive film 11 was removed. The external portions 251 and 252 may be formed by a wet etching process. The wet etching process is a process for etching the exposed portion of the upper side of the substrate 200 by using an etchant that may include hydrogen fluoride (HF). In some embodiments, the portion of the substrate 200 corresponding to the external portions 251 and 252 may be etched with a depth equal to or greater than 0.15 t. In some embodiments, the external portions 251 and 252 may be etched to different depths.

In some embodiments, a recess portion 201 is formed by etching the exposed portion of the lower side of the substrate 200 at which the second acid-resistive film 12 has been removed. The recess portion 201 may be formed by a wet etching process, and it may be formed with a depth of about 0.005 t from the lower side of the substrate 200.

Figure 18:
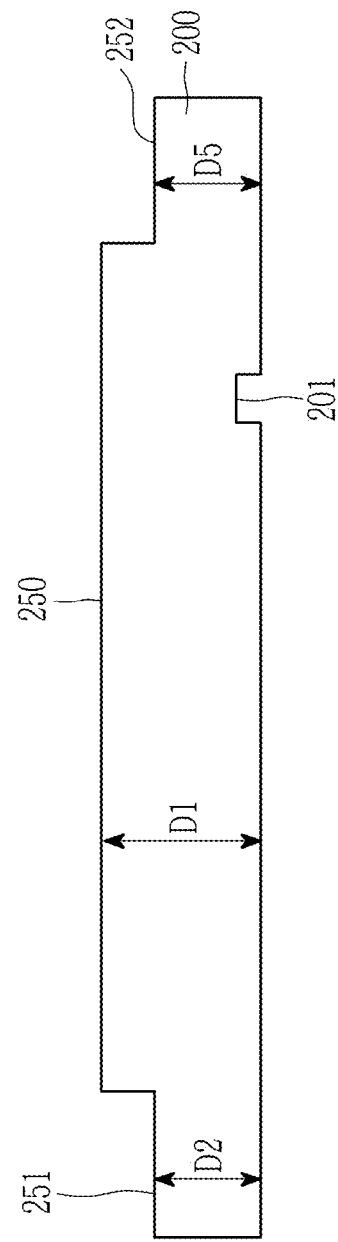

FIG. 18 shows a second substrate 200 according to some exemplary embodiments.

Referring to FIG. 18, the first acid-resistive film 11 and the second acid-resistive film 12 are removed after the etching process described with reference to FIG. 17. Accordingly, the substrate 200 including the recess portion 201 on the lower side of the substrate 200 may be formed, wherein the thickness D1 of the center portion 250 of the substrate 200 may be from 0.3 t to 0.4 t, and the thicknesses D2 and D5 of the external portions 251 and 252, respectively, may be formed to be equal to or less than 0.25 t.

According to some exemplary embodiments, regarding the substrate 200 including a recess portion 201 in the light transmission area (TA), the external portion 251 and 252 of the substrate 200 may be etched in the process (e.g., during the same process) for etching the recess portion 201, thereby reducing the number of processing stages and improving productivity.

According to some exemplary embodiments, during the manufacture of the display device, the first substrate 100 including a center portion 150 and an external portion 151 and 152 may be manufactured, as described with reference to FIG. 5 to FIG. 10, and the first substrate 100 and the second substrate 200 may be bonded to each other by a sealing portion 30. Accordingly, the thicknesses of the external portions of the first substrate 100 and the second substrate 200 are respectively formed to each be equal to or less than 0.25 t, thereby allowing a cell cutting process (e.g., cutting to form a display unit) by the cutting wheel.

A display device including a recess portion according to some exemplary embodiments will now be described with reference to FIG. 19 and FIG. 20.

Figure 19:
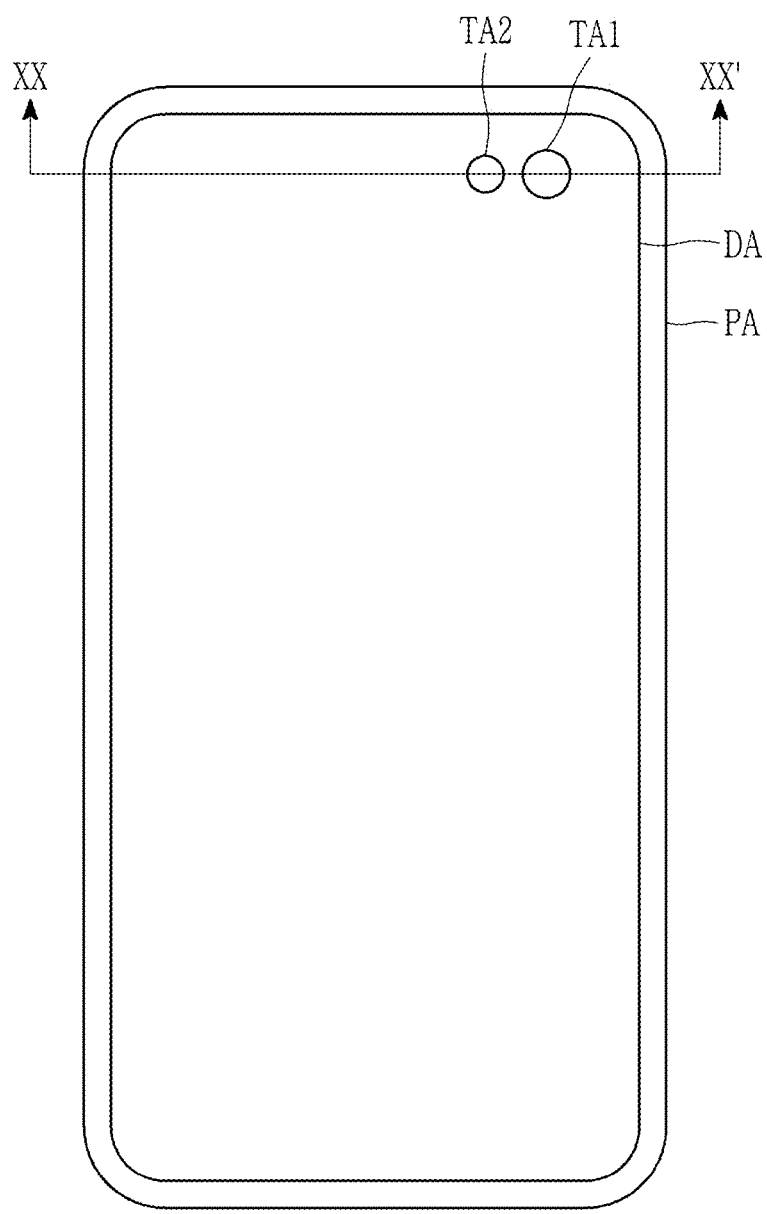
FIG. 19 shows a plan view of a display device according to an exemplary embodiment.

FIG. 19 shows a plan view of a display device according to some exemplary embodiments, and FIG. 20 shows a cross-sectional view of a display device taken along the line XX-XX' of FIG. 19. The display device according to some exemplary embodiments described with reference to FIG. 19 and FIG. 20 is similar to the display device according to some exemplary embodiments described with reference to FIG. 11 and FIG. 12. Therefore, differences will be focused on and described, and redundant descriptions may not be repeated.

Referring to FIG. 19, the display device according to some exemplary embodiments includes: a display area (DA) occupying most of the front side (e.g., the upper side) of the display device; a non-display area (PA) that is a peripheral area surrounding the display area (DA); and a first light transmission area (TA1) and a second light transmission area (TA2) in the display area (DA) to transmit light.

Referring to FIG. 20, the center portion 250 of the second substrate 200 includes a first recess portion 201 and a second recess portion 202 on one side (e.g., a lower side) facing the first substrate 100.

The first recess portion 201 and the second recess portion 202 correspond to the first light transmission area (TA1) and the second light transmission area (TA2), respectively, of FIG. 19. The display element 110 is not at the portions that correspond to the first recess portion 201 and the second recess portion 202, and optical elements such as, for example, a camera and a sensor may be on the lower side of the first substrate 100. The optical elements (e.g., the camera and the sensor) may be closely attached to the lower side of the first substrate 100, so as to increase transmittance.

The first recess portion 201 and the second recess portion 202 are in the display area (DA), so a portion of the display element 110 is in the area between the first recess portion 201 and the second recess portion 202.

Methods of manufacturing the display device according to some exemplary embodiments may include a cell cutting process (e.g., cutting to form a display unit) by the cutting wheel 700 as (e.g., after) the thicknesses of the external portions 151 and 152 of the first substrate 100 and the external portions 251 and 252 of the second substrate 200 are formed (e.g., have been formed) to be equal to or less than 0.25 t. In some embodiments, the cell cutting process (e.g., cutting to form a display unit) may be performed in the sealing area (SA), thereby reducing the dead space of the substrate and reducing the cost of processing the external portion.

While this present disclosure has described some exemplary embodiments, it is to be understood that the present disclosure is not limited to the disclosed embodiments, but is intended to cover various modifications and equivalent arrangements included within the spirit and scope of the appended claims.

What is claimed is:

1. A display device comprising:
a display area;
a non-display area surrounding the display area and including a sealing area;
a first substrate including a center portion including a portion in the display area and an external portion including a portion in the sealing area;
a second substrate including a center portion including a portion in the display area and an external portion including a portion in the sealing area; and
a sealing portion between the first substrate and the second substrate and in the sealing area,
wherein each of the first substrate and the second substrate is a single layer substrate made of glass,
a thickness of the center portion of the first substrate is different from a thickness of the external portion of the first substrate, and
a thickness of the center portion of the second substrate is different from a thickness of the external portion of the second substrate.

2. The display device of claim 1, wherein
the thickness of the center portion of the first substrate is greater than the thickness of the external portion of the first substrate.

3. The display device of claim 2, wherein
the thickness of the center portion of the first substrate is from 0.3 mm to 0.4 mm, and the thickness of the external portion of the first substrate is equal to or less than 0.25 mm.

4. The display device of claim 1, wherein
the thickness of the center portion of the second substrate is greater than the thickness of the external portion of the second substrate.

5. The display device of claim 4, wherein
the thickness of the center portion of the second substrate is from 0.3 mm to 0.4 mm, and the thickness of the external portion of the second substrate is equal to or less than 0.25 mm.

6. The display device of claim 1, wherein
the external portion of the first substrate includes a first external portion and a second external portion on two opposite sides along a horizontal direction of the center portion of the first substrate, and
the thickness of the first external portion of the first substrate is different from the thickness of the second external portion of the first substrate.

7. A display device comprising:
a display area;
a non-display area surrounding the display area and including a sealing area;
a first substrate including a center portion including a portion in the display area and an external portion including a portion in the sealing area;
a second substrate including a center portion including a portion in the display area and an external portion including a portion in the sealing area; and
a sealing portion between the first substrate and the second substrate and in the sealing area,
wherein a thickness of the center portion of the first substrate is different from a thickness of the external portion of the first substrate,
a thickness of the center portion of the second substrate is different from a thickness of the external portion of the second substrate,
the external portion of the first substrate includes a first external portion and a second external portion on two opposite sides along a horizontal direction of the center portion of the first substrate,
the thickness of the first external portion of the first substrate is different from the thickness of the second external portion of the first substrate,
the external portion of the second substrate includes a first external portion and a second external portion on two opposite sides along a horizontal direction of the center portion of the second substrate, and
the thickness of the first external portion of the second substrate is different from the thickness of the second external portion of the second substrate.

8. The display device of claim 1, wherein
the first substrate and the second substrate include a cutting line at the sealing area.

9. A display device comprising:
a display area;
a non-display area surrounding the display area and including a sealing area;

a first substrate including a center portion including a portion in the display area and an external portion including a portion in the sealing area;

a second substrate including a center portion including a portion in the display area and an external portion including a portion in the sealing area;

a sealing portion between the first substrate and the second substrate and in the sealing area; and an optical element on a lower side of the first substrate, wherein the center portion of the second substrate includes at least one recess portion on one side facing the first substrate, the optical element is at a portion corresponding to the recess portion, each of the first substrate and the second substrate is a single layer substrate made of glass, a thickness of the center portion of the first substrate is different from a thickness of the external portion of the first substrate, and a thickness of the center portion of the second substrate is different from a thickness of the external portion of the second substrate.

10. The display device of claim 9, wherein each of the thicknesses of the center portions of the first substrate and the second substrate are greater than each of the thicknesses of the external portions of the first substrate and the second substrate.

11. The display device of claim 10, wherein each of the thicknesses of the center portions of the first substrate and the second substrate is from 0.3 mm to 0.4 mm, and each of the thicknesses of the external portions of the first substrate and the second substrate is equal to or less than 0.25 mm.

12. The display device of claim 9, wherein the external portion of the first substrate includes a first external portion and a second external portion on two opposite sides along a horizontal direction of the center portion of the first substrate, the external portion of the second substrate includes a first external portion and a second external portion on two opposite sides along a horizontal direction of the center portion of the second substrate, a thickness of the first external portion of the first substrate is different from a thickness of the second external portion of the first substrate, and a thickness of the first external portion of the second substrate is different from a thickness of the second external portion of the second substrate.

13. The display device of claim 12, wherein each of the thicknesses of the first external portion of the first substrate, the second external portion of the first substrate, the first external portion of the second substrate, and the second external portion of the second substrate is equal to or less than 0.25 mm.

14. The display device of claim 9, wherein the first substrate and the second substrate include a cutting line at the sealing area.

* * * * *